(12) United States Patent
Hwang et al.

(10) Patent No.: US 9,685,400 B2
(45) Date of Patent: Jun. 20, 2017

(54) SEMICONDUCTOR PACKAGE AND METHOD OF FORMING THE SAME

(71) Applicants: Tae-Joo Hwang, Anyang-si (KR);
Tae-Gyeong Chung, Suwon-si (KR);
Eun-Chul Ahn, Yongin-si (KR)

(72) Inventors: Tae-Joo Hwang, Anyang-si (KR);
Tae-Gyeong Chung, Suwon-si (KR);
Eun-Chul Ahn, Yongin-si (KR)

(73) Assignee: Samsung Electronics Co., Ltd.,
Gyeonggi-Do (KR)

( * ) Notice: Subject to any disclaimer, the term of this patent is extended or adjusted under 35 U.S.C. 154(b) by 2 days.

(21) Appl. No.: 15/010,826

(22) Filed: Jan. 29, 2016

(65) Prior Publication Data

US 2016/0148913 A1 May 26, 2016

Related U.S. Application Data

(63) Continuation of application No. 14/263,385, filed on Apr. 28, 2014, which is a continuation of application
(Continued)

(30) Foreign Application Priority Data

May 8, 2007 (KR) .................. 10-2007-0044643

(51) Int. Cl.
*H01L 23/48* (2006.01)
*H01L 23/498* (2006.01)
(Continued)

(52) U.S. Cl.
CPC ...... *H01L 23/49811* (2013.01); *H01L 23/481* (2013.01); *H01L 24/73* (2013.01);
(Continued)

(58) Field of Classification Search
CPC . H01L 23/49811; H01L 23/481; H01L 24/73; H01L 24/81; H01L 24/97;
(Continued)

(56) References Cited

U.S. PATENT DOCUMENTS 5,173,766 A 12/1992 Long et al.
5,491,303 A 2/1996 Weiss
(Continued)

FOREIGN PATENT DOCUMENTS

JP S63-156348 A 6/1988
JP 2001-102479 A 4/2001
(Continued)

*Primary Examiner* — Nicholas Tobergte
(74) *Attorney, Agent, or Firm* — Harness, Dickey & Pierce, P.L.C.

(57) ABSTRACT

A semiconductor package includes a first package substrate, a first semiconductor chip disposed on the first package substrate, the semiconductor chip including first through hole vias, and a chip package disposed on the first semiconductor chip, the chip package including a second package substrate and a second semiconductor chip disposed on the second package substrate, wherein a first conductive terminal is disposed on a first surface of the semiconductor chip and a second conductive terminal is disposed on a first surface of the second package substrate, the first conductive terminal disposed on the second conductive terminal.

20 Claims, 17 Drawing Sheets

Related U.S. Application Data

No. 13/785,811, filed on Mar. 5, 2013, now Pat. No. 8,736,035, which is a continuation of application No. 12/875,551, filed on Sep. 3, 2010, now Pat. No. 8,421,244, which is a continuation-in-part of application No. 12/149,741, filed on May 7, 2008, now Pat. No. 8,022,555.

(51) Int. Cl.

| | | |
|---|---|---|
| *H01L 25/03* | (2006.01) | |
| *H01L 25/065* | (2006.01) | |
| *H01L 25/10* | (2006.01) | |
| *H01L 23/00* | (2006.01) | |
| *H01L 25/18* | (2006.01) | |

(52) U.S. Cl.
CPC .............. *H01L 24/81* (2013.01); *H01L 24/97* (2013.01); *H01L 25/03* (2013.01); *H01L 25/0657* (2013.01); *H01L 25/105* (2013.01); H01L 24/06 (2013.01); H01L 24/16 (2013.01); H01L 24/29 (2013.01); H01L 24/31 (2013.01); H01L 24/48 (2013.01); H01L 24/85 (2013.01); H01L 25/18 (2013.01); H01L 2224/0401 (2013.01); H01L 2224/05009 (2013.01); H01L 2224/0557 (2013.01); H01L 2224/13025 (2013.01); H01L 2224/16145 (2013.01); H01L 2224/16225 (2013.01); H01L 2224/16235 (2013.01); H01L 2224/32145 (2013.01); H01L 2224/32225 (2013.01); H01L 2224/48091 (2013.01); H01L 2224/48227 (2013.01); H01L 2224/48235 (2013.01); H01L 2224/73204 (2013.01); H01L 2224/73265 (2013.01); H01L 2224/81801 (2013.01); H01L 2224/85 (2013.01); H01L 2224/97 (2013.01); H01L 2225/0651 (2013.01); H01L 2225/06513 (2013.01); H01L 2225/06517 (2013.01); H01L 2225/06541 (2013.01); H01L 2225/06572 (2013.01); H01L 2225/1041 (2013.01); H01L 2225/1058 (2013.01); H01L 2924/0002 (2013.01); H01L 2924/00014 (2013.01); H01L 2924/01005 (2013.01); H01L 2924/01006 (2013.01); H01L 2924/01033 (2013.01); H01L 2924/078 (2013.01); H01L 2924/12042 (2013.01); H01L 2924/14 (2013.01); H01L 2924/15311 (2013.01); H01L 2924/181 (2013.01)

(58) Field of Classification Search
CPC ... H01L 25/03; H01L 25/0657; H01L 25/105; H01L 24/06; H01L 24/16; H01L 24/29; H01L 24/31; H01L 24/48; H01L 24/85; H01L 25/18

See application file for complete search history.

(56) References Cited

U.S. PATENT DOCUMENTS

| | | |
|---|---|---|
| 5,648,684 A | 7/1997 | Bertin et al. |
| 5,708,567 A | 1/1998 | Shim et al. |
| 5,861,666 A | 1/1999 | Bellaar |
| 5,977,640 A | 11/1999 | Bertin et al. |
| 6,281,042 B1 | 8/2001 | Ahn et al. |
| 6,294,406 B1 | 9/2001 | Bertin et al. |
| 6,344,401 B1 | 2/2002 | Lam |
| 6,392,296 B1 | 5/2002 | Ahn et al. |
| 6,413,798 B2 | 7/2002 | Asada |
| 6,603,072 B1 | 8/2003 | Foster et al. |
| 6,838,761 B2 | 1/2005 | Karnezos |
| 6,861,761 B2 | 3/2005 | Yang et al. |
| 6,885,106 B1 | 4/2005 | Damberg et al. |
| 6,906,416 B2 | 6/2005 | Karnezos |
| 6,927,484 B2 | 8/2005 | Thomas et al. |
| 7,115,972 B2 | 10/2006 | Dotta et al. |
| 7,211,472 B2* | 5/2007 | Hedler ................ H01L 23/5389 257/737 |
| 7,218,006 B2 | 5/2007 | Kang et al. |
| 7,247,517 B2 | 7/2007 | Rumer et al. |
| 7,247,935 B2 | 7/2007 | Kawano |
| 7,279,795 B2 | 10/2007 | Periaman et al. |
| 7,298,032 B2 | 11/2007 | Kim et al. |
| 7,327,038 B2 | 2/2008 | Kwon et al. |
| 7,390,700 B2 | 6/2008 | Gerber et al. |
| 7,394,148 B2 | 7/2008 | Karnezos |
| 7,420,269 B2 | 9/2008 | Ha et al. |
| 7,576,435 B2 | 8/2009 | Chao |
| 7,834,463 B2 | 11/2010 | Kim et al. |
| 8,093,726 B2 | 1/2012 | Park |
| 8,410,595 B2 | 4/2013 | Kroehnert et al. |
| 8,736,035 B2* | 5/2014 | Hwang ................ H01L 23/481 257/668 |
| 2003/0153122 A1 | 8/2003 | Brooks |
| 2004/0188827 A1 | 9/2004 | Akashi |
| 2005/0156322 A1* | 7/2005 | Smith ................ H01L 25/0657 257/778 |
| 2005/0184399 A1* | 8/2005 | Damberg .......... H01L 23/49816 257/777 |
| 2007/0007641 A1 | 1/2007 | Lee et al. |
| 2007/0108583 A1 | 5/2007 | Shim et al. |
| 2007/0190690 A1 | 8/2007 | Chow et al. |
| 2007/0290333 A1 | 12/2007 | Saini et al. |
| 2008/0036082 A1 | 2/2008 | Eun |
| 2008/0157330 A1* | 7/2008 | Kroehnert ........... H01L 21/4871 257/686 |
| 2010/0207266 A1* | 8/2010 | Chang ................... H01L 21/563 257/692 |

FOREIGN PATENT DOCUMENTS

| | | |
|---|---|---|
| KR | 10-0349283 | 8/2002 |
| KR | 2006-0074146 A | 7/2006 |
| KR | 2006-0074796 A | 7/2006 |
| KR | 2006-0084120 A | 7/2006 |
| KR | 2007-0006327 A | 1/2007 |

\* cited by examiner

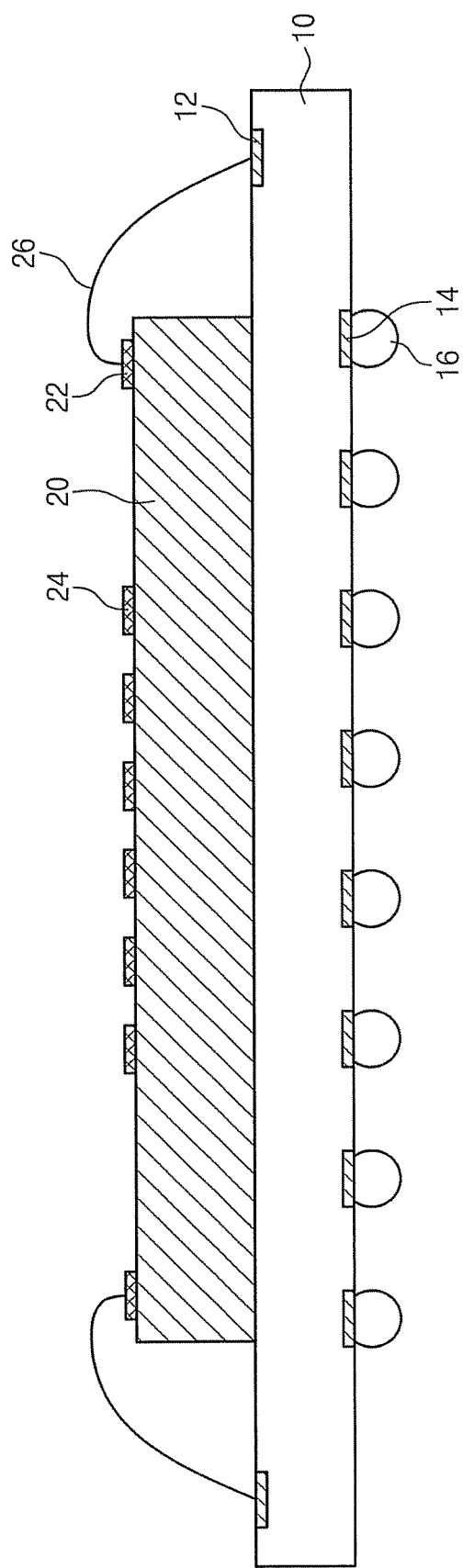

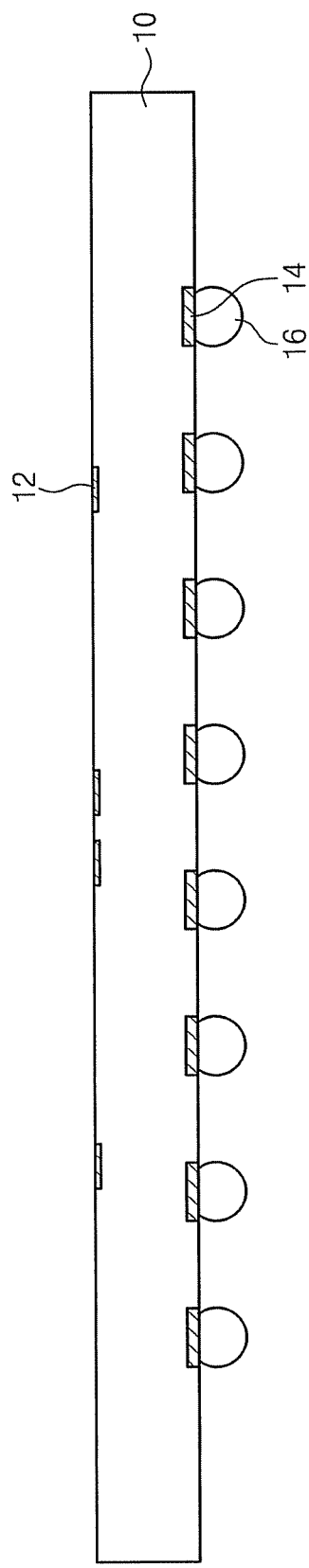

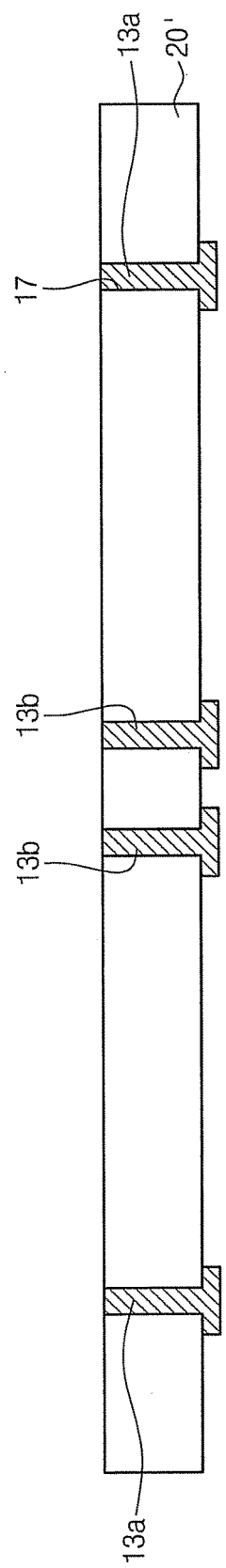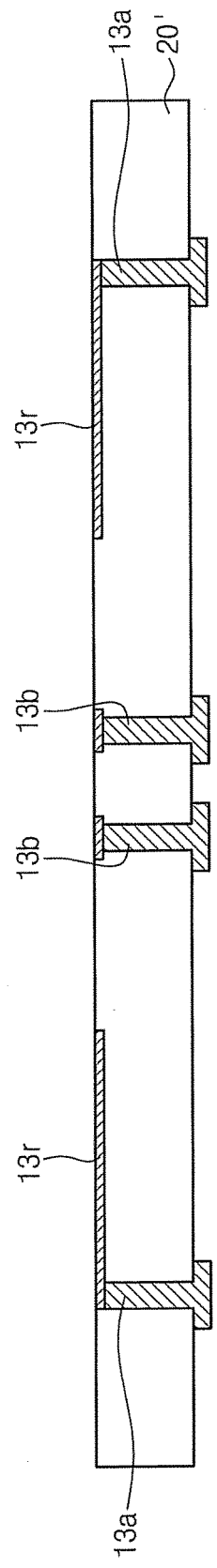

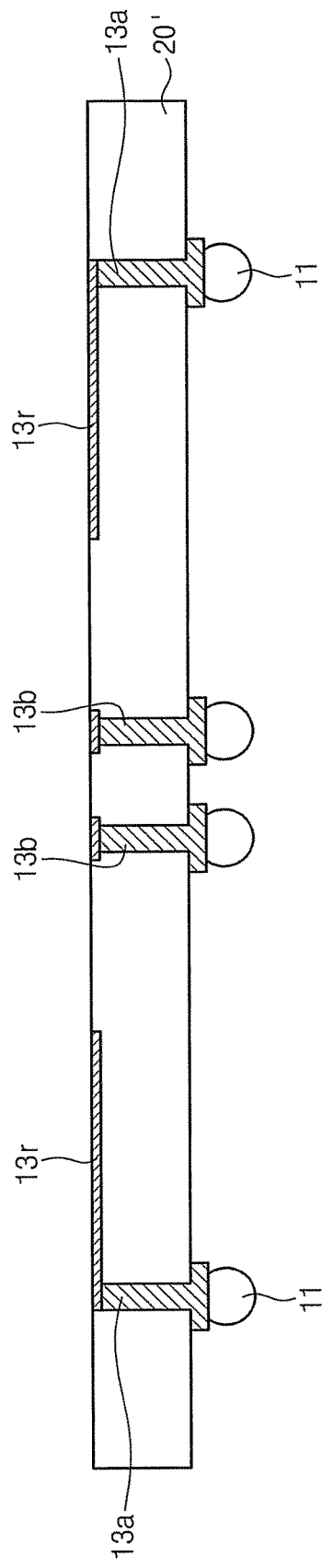

SEMICONDUCTOR PACKAGE AND METHOD OF FORMING THE SAME

CROSS-REFERENCE TO RELATED APPLICATIONS

This application is a Continuation claiming priority under 35 U.S.C. §120 to U.S. application Ser. No. 14/263,385, filed Apr. 28, 2014, which is a Continuation under 35 U.S.C. §120 of U.S. application Ser. No. 13/785,811, filed Mar. 5, 2013, now U.S. Pat. No. 8,736,035, which is a Continuation under 35 U.S.C. §120 of U.S. application Ser. No. 12/875,551, filed on Sep. 3, 2010, now U.S. Pat. No. 8,421,244, which is a Continuation-in-part under 35 U.S.C. §120 of U.S. application Ser. No. 12/149,741, filed on May 7, 2008, now U.S. Pat. No. 8,022,555, which claims priority under 35 U.S.C. §119 to Korean Application No. 10-2007-0044643, filed on May 8, 2007 in the Korean Patent Office (KIPO), the disclosures of each of the above applications are hereby incorporated herein by reference.

BACKGROUND

Technical Field

The present disclosure relates to semiconductor devices and methods of forming the same.

Description of the Related Art

A system in package (SIP) includes a plurality of integrated circuits enclosed in a single package. The SIP can be typically used inside a mobile phone or digital music player. Dies containing integrated circuits, may be stacked vertically on a substrate.

SUMMARY

A semiconductor package may include a printed circuit board (PCB). A first semiconductor chip may be mounted on the PCB. A chip package may be mounted on the first semiconductor chip. The chip package may be in direct contact with the first semiconductor chip.

A semiconductor package may include a printed circuit board (PCB), a first semiconductor chip mounted on the PCB, an interposer in direct contact with the first semiconductor chip, a semiconductor chip group mounted on the interposer, an encapsulation layer covering the interposer and the semiconductor chip group, and/or a molding layer covering the encapsulation layer, the first semiconductor chip, and the PCB, wherein the interposer electrically connects the first semiconductor chip to the semiconductor chip group.

A method of forming a semiconductor package may include mounting a first semiconductor chip on a printed circuit board (PCB). A chip package may be prepared and mounted on the first semiconductor chip. The chip package may be mounted so as to be in direct contact with the first semiconductor chip.

A semiconductor package may include a first package substrate, a first semiconductor chip disposed on the first package substrate, the semiconductor chip including first through hole vias, and a chip package disposed on the first semiconductor chip, the chip package including a second package substrate and a second semiconductor chip disposed on the second package substrate, wherein a first conductive terminal is disposed on a first surface of the first semiconductor chip and a second conductive terminal is disposed on a first surface of the second package substrate, the first conductive terminal disposed on the second conductive terminal.

The semiconductor package may further include a third conductive terminal disposed on a second surface of the first semiconductor chip, and a fourth conductive terminal disposed on a first surface of the first package substrate, the third conductive terminal disposed on the fourth conductive terminal. The first conductive terminal and the fourth conductive terminal may respectively include a bump pad and the second conductive terminal and the third conductive terminal may respectively include a bump.

The semiconductor package may further include a redistribution line disposed on the first surface of the first semiconductor chip and connected to the first conductive terminal. The semiconductor package may further include a redistribution line disposed on a second surface of the first semiconductor chip and connected to the third conductive terminal.

The first package substrate may include a PCB including an epoxy compound, resin or polyimide. The second package substrate may include a PCB including an epoxy compound, resin or polyimide. The second package substrate may include silicon and may include second through hole vias disposed in the second package substrate.

The first semiconductor chip and the second semiconductor chip can be electrically connected by the second through hole vias, the first conductive terminal, and the second conductive terminal. The first semiconductor chip and the first package substrate can be electrically connected by the first through hole vias, the third conductive terminal, and the fourth conductive terminal. The first semiconductor chip may include a logic device and the second semiconductor chip may include a memory device.

A third semiconductor chip can be disposed between the first semiconductor chip and the first package substrate, the third semiconductor chip may include third through hole vias. A size of the first semiconductor chip can be substantially same as a size of the third semiconductor chip. Alternatively, a size of the first semiconductor chip can be different from a size of the third semiconductor chip.

The second package substrate can be underfilled using an adhesive. The first semiconductor chip can also be underfilled using an adhesive.

The semiconductor package may further include a first encapsulation layer covering the chip package, and a second encapsulation layer covering the first encapsulation layer, the first semiconductor chip, and the first package substrate.

A semiconductor package may include a first package substrate, a first semiconductor chip disposed on the first package substrate, and a chip package disposed on the first semiconductor chip, the chip package including a second package substrate including an organic material and a second semiconductor chip disposed on the second package substrate, wherein a first conductive terminal is disposed on a first surface of the first semiconductor chip and a second conductive terminal is disposed on a first surface of the second package substrate, the first conductive terminal disposed on the second conductive terminal.

A semiconductor package may include a first package substrate, a first semiconductor chip disposed on the first package substrate, the semiconductor chip including first through hole vias, and a chip package disposed on the first semiconductor chip, the chip package including a second package substrate including an organic material and a second semiconductor chip disposed on the second package substrate, wherein a first conductive terminal is disposed on a first surface of the semiconductor chip and a second conductive terminal is disposed on a first surface of the second package substrate, the first conductive terminal disposed on the second conductive terminal.

BRIEF DESCRIPTION OF THE DRAWINGS

Example embodiments herein can be understood in more detail from the following descriptions taken in conjunction with the accompanying drawings, in which:

FIG. 2 and FIGS. 3A to 3D are cross-sectional views of a method of forming a semiconductor package according to example embodiments.

FIGS. 8, 9A-9C, and 10A-10C show a method of forming a semiconductor package according to example embodiments.

DETAILED DESCRIPTION

Figure 1A:
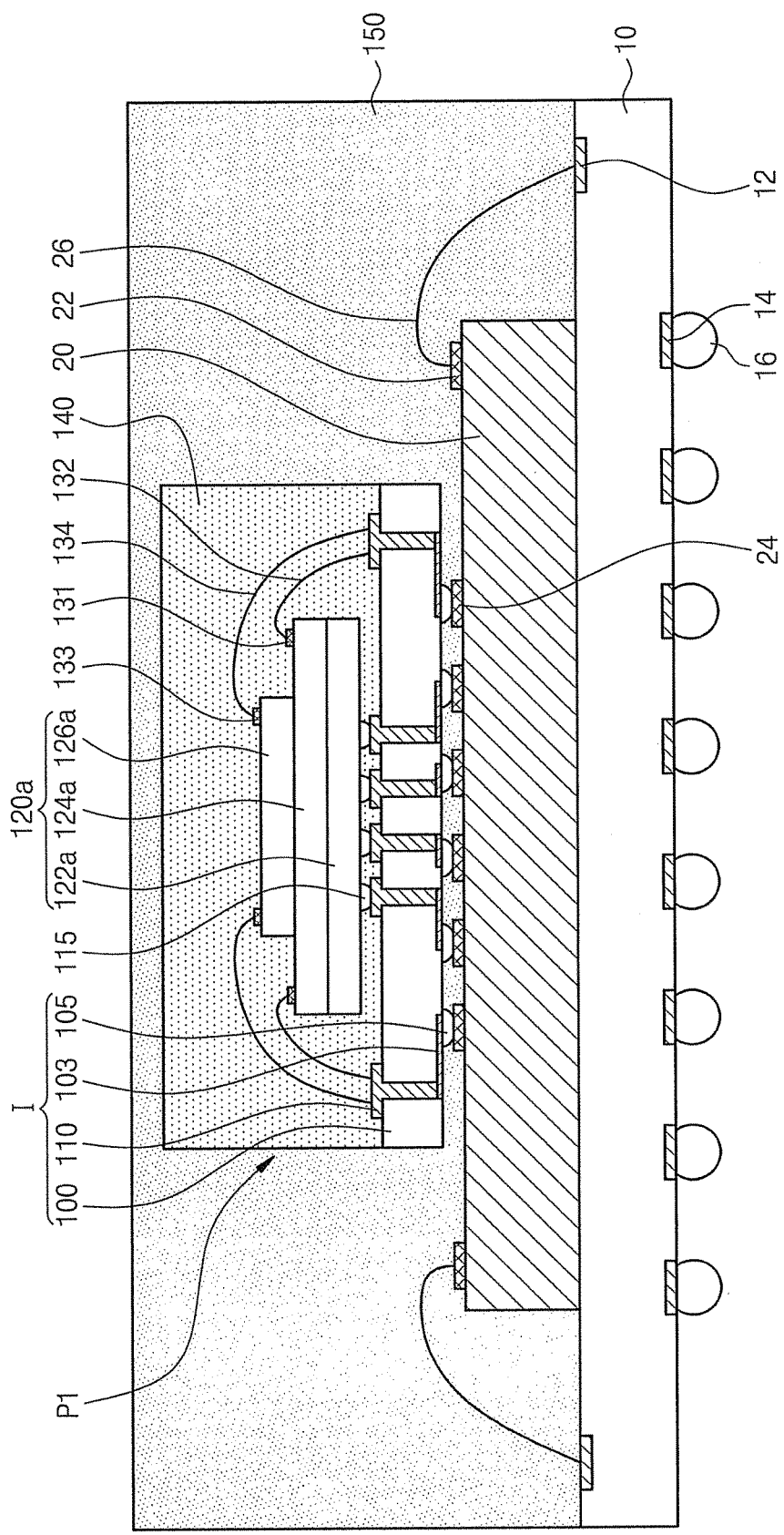
FIG. 1A is a cross-sectional view of a semiconductor package according to example embodiments.

It will be understood that when an element or layer is referred to as being "on", "connected to", "coupled to", or "covering" another element or layer, it may be directly on, connected to, coupled to, or covering the other element or layer or intervening elements or layers may be present. Like numbers refer to like elements throughout the specification. As used herein, the term "and/or" includes any and all combinations of one or more of the associated listed items.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, e.g., "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an," and "the" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing.

Example embodiments will be described in further detail below with reference to the accompanying drawings. Example embodiments, however, may be embodied in many different forms and should not be construed as limited to the examples set forth herein. In the drawings, the thicknesses of layers and/or regions may have been exaggerated for clarity.

FIG. 1A is a cross-sectional view of a semiconductor package according to example embodiments. Referring to FIG. 1A, the semiconductor package may include a printed circuit board (PCB) 10, a first semiconductor chip 20 and a chip package P1. Lower substrate patterns 14 may be disposed on a lower surface of the PCB 10. Solder balls 16 may be adhered to the lower substrate patterns 14. The solder balls 16 may electrically connect the PCB 10 to an external circuit. Upper substrate patterns 12 may be disposed on an upper surface of the PCB 10.

The first semiconductor chip 20 may be disposed on the PCB 10. An adhesive layer (not shown) may be interposed between the first semiconductor chip 20 and the PCB 10. The first semiconductor chip 20 may be a non-memory device (e.g., logic device). The first semiconductor chip 20 may include first bonding pads 22 disposed near the edge of the upper surface of the first semiconductor chip 20. The first bonding pads 22 may be electrically connected to the upper substrate patterns 12 by first wires 26. First bump pads 24 may be disposed on the upper surface of the first semiconductor chip 20. The first bump pads 24 may be disposed near the center of the upper surface of the first semiconductor chip 20.

The chip package P1 may be directly connected to the first semiconductor chip 20. The chip package P1 may include an interposer I, a semiconductor chip group 120a, and an encapsulation layer 140. The interposer I may electrically connect the first semiconductor chip 20 and the semiconductor chip group 120a. The interposer I may include a semiconductor substrate 100 having through-hole vias 110, redistribution patterns 103 connected to the through-hole vias 110, and first bumps 105 connected to the redistribution patterns 103. The redistribution patterns 103 may be disposed on an insulation layer (not shown) on a lower surface of the semiconductor substrate 100. The first bumps 105 may be disposed on the lower surface of the semiconductor substrate 100 so as to be connected to the redistribution patterns 103 and the first bump pads 24 on the first semiconductor chip 20.

The semiconductor chip group 120a may be disposed on the interposer I. The semiconductor chip group 120a may include a flip chip 122a as a second semiconductor chip, a third semiconductor chip 124a, and a fourth semiconductor chip 126a. Second bumps 115 may be provided on the lower surface of the flip chip 122a. The second bumps 115 may be connected to the through-hole vias 110. The flip chip 122a, the third semiconductor chip 124a, and the fourth semiconductor chip 126a may be memory devices. Adhesive layers (not shown) may be interposed between the flip chip 122a and the third semiconductor chip 124a and between the third semiconductor chip 124a and the fourth semiconductor chip 126a.

The third semiconductor chip 124a and the fourth semiconductor chip 126a may be electrically connected to the through-hole vias 110 by second wires 132 and third wires 134, respectively. An encapsulation layer 140 may be provided so as to cover the semiconductor chip group 120a and the interposer I. The encapsulation layer 140 may include an epoxy molding compound (EMC). A molding layer 150 may be provided so as to cover the encapsulation layer 140, the first semiconductor chip 20, and the PCB 10. The molding layer 150 may be formed of the same material as the encapsulation layer 140. Alternatively, the molding layer 150 may be formed of a different material from the encapsulation layer 140.

The chip package P1 may be directly connected to the first semiconductor chip 20. Even when the locations of the bumps and pads of the semiconductor chip group 120a and the first semiconductor chip 20 have been modified, the semiconductor chip group 120a and the first semiconductor chip 20 may still be connected to each other by means of the interposer I. Thus, a semiconductor package capable of relatively high-speed operation may be realized, regardless of whether design modifications may be needed in connection with the logic device and/or memory device.

Figure 1B:
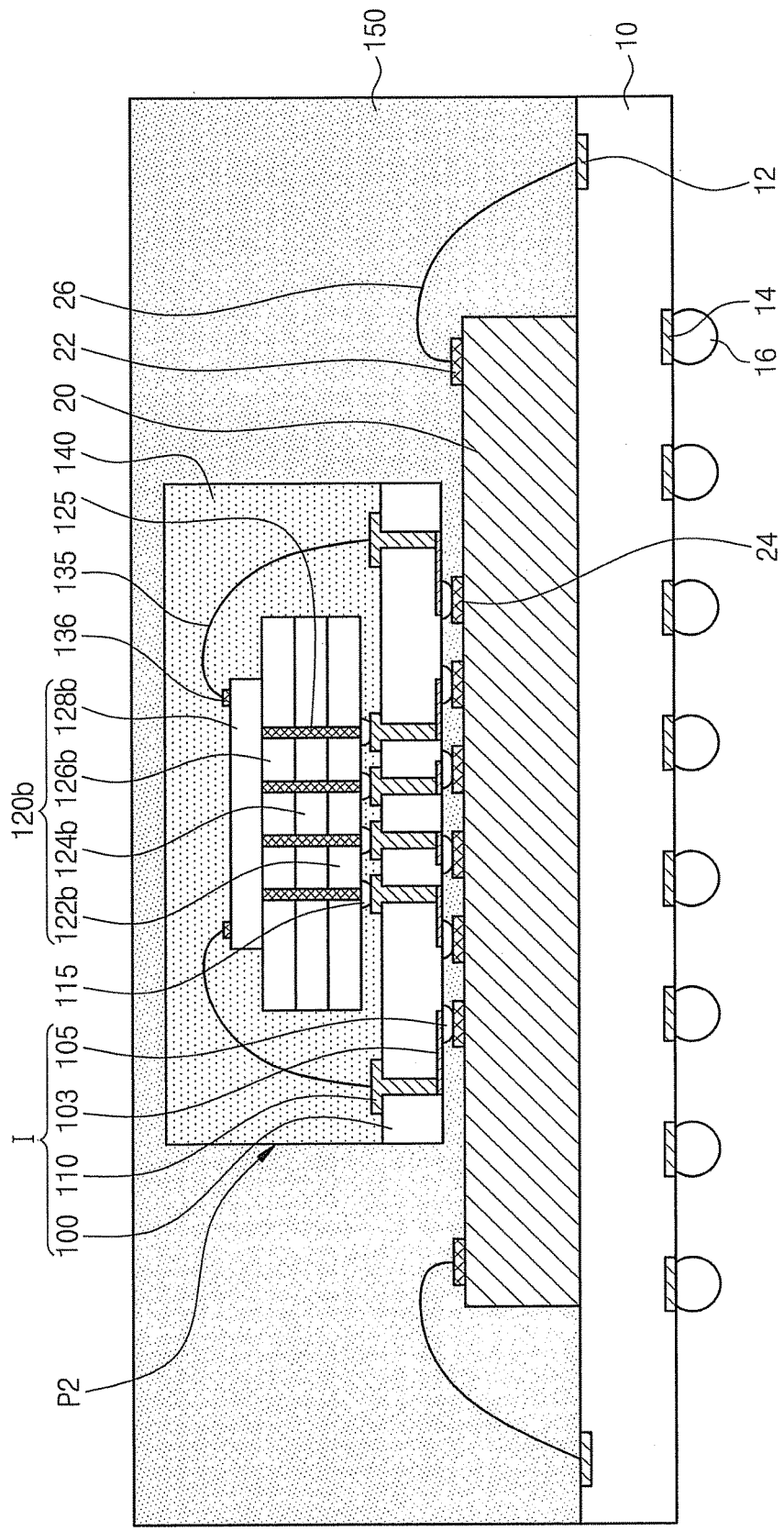
FIG. 1B is a cross-sectional view of a semiconductor package according to example embodiments.

FIG. 1B is a cross-sectional view of a semiconductor package according to example embodiments. It should be understood that the description of common features already discussed above will be omitted for brevity, while any new or different features will be described in further detail below. Referring to FIG. 1B, a semiconductor package may include a printed circuit board (PCB) 10, a first semiconductor chip 20, and a chip package P2. The PCB 10 may include upper substrate patterns 12, lower substrate patterns 14, and solder balls 16. The first semiconductor chip 20 may include first bonding pads 22 and first bump pads 24 on the upper surface of the first semiconductor chip 20. First wires 26 may be provided to electrically connect the first bonding pads 22 and the upper substrate patterns 12.

The chip package P2 may be directly connected to the first semiconductor chip 20. The chip package P2 may include an interposer I, a semiconductor chip group 120b, and an encapsulation layer 140. The interposer I may include a semiconductor substrate 100 having through-hole vias 110, redistribution patterns 103 disposed on the lower surface of the semiconductor substrate 100, and first bumps 105 connected to the redistribution patterns 103.

The semiconductor chip group 120b may include a second semiconductor chip 122b, a third semiconductor chip 124b, a fourth semiconductor chip 126b, and a fifth semiconductor chip 128b. The second, third, and fourth semiconductor chips 122b, 124b, and 126b, respectively, may be electrically connected to each other by penetration interconnections 125. The penetration interconnections 125 may contact second bumps 115. The fifth semiconductor chip 128b may include second bonding pads 136 on its upper surface. The second bonding pads 136 may be electrically connected to the through-hole vias 110 by means of second wirings 135.

It should be understood that the chip packages P1 and P2 of FIG. 1 and FIG. 2, respectively, may be embodied in various forms and may include additional semiconductor chips. It should also be understood that the various shapes and forms of the semiconductor chip groups 120a and 120b are only examples and should not to be construed to limit example embodiments of the present application.

FIG. 2 and FIGS. 3A to 3D are cross-sectional views of a method of forming a semiconductor package according to example embodiments. Referring to FIG. 2, a first semiconductor chip 20 may be mounted on a printed circuit board (PCB) 10. The PCB 10 may include upper substrate patterns 12 on its upper surface and lower substrate patterns 14 on its lower surface. Solder balls 16 may be bonded to the lower substrate patterns 14 to provide a connection to an external circuit. The first semiconductor chip 20 may include first bonding pads 22 near the edges of its upper surface. First wires 26 may connect the first bonding pads 22 and the upper substrate patterns 12. First bump pads 24 may be formed near the center of the upper surface of the first semiconductor chip 20.

Figure 3A:
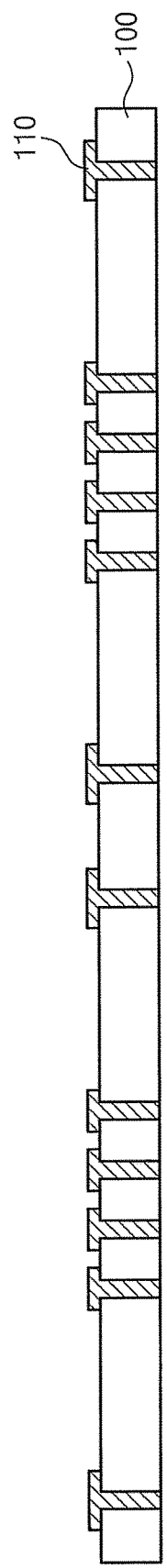

Referring to FIG. 3A, through-hole vias 110 may be formed in a semiconductor substrate 100. Forming the through-hole vias 110 may include creating via holes in the semiconductor substrate 100 with a laser drill and filling the via holes with a conductive metal. The via holes may be filled with a conductive metal using an electroplating method.

Figure 3B:
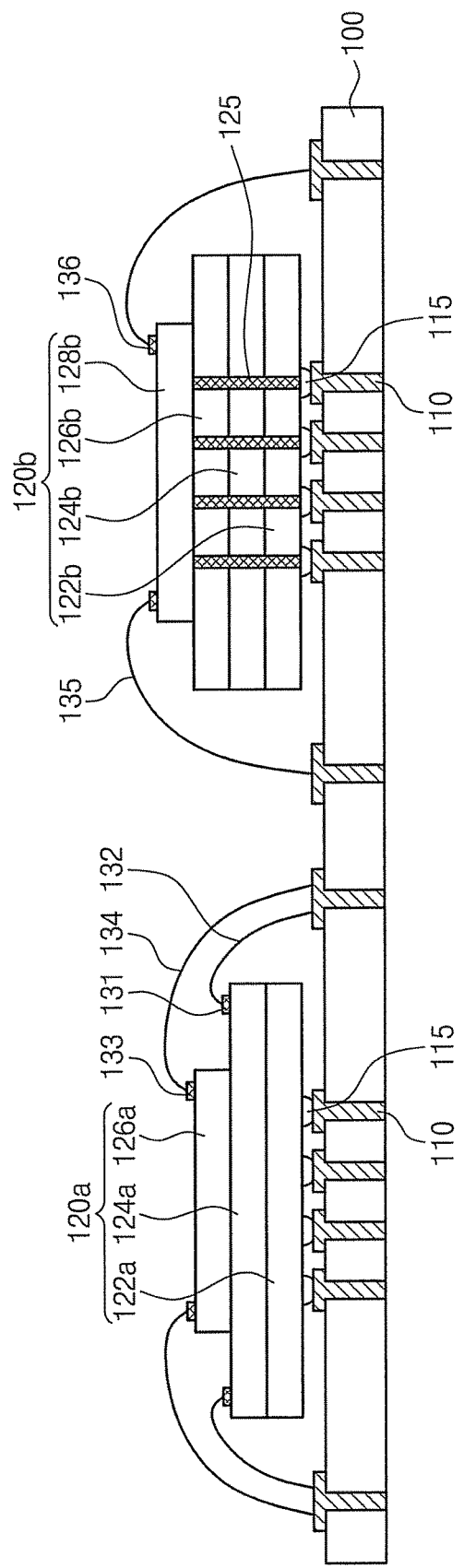

Referring to FIG. 3B, first and second semiconductor chip groups 120a and 120b may be mounted on the semiconductor substrate 100. The first semiconductor chip group 120a may include a flip chip 122a as a second semiconductor chip, a third semiconductor chip 124a, and a fourth semiconductor chip 126a. The flip chip 122a may have second bumps 115 on its lower surface.

The second bumps 115 may be connected to the through-hole vias 110. The third semiconductor chip 124a and the fourth semiconductor chip 126a may include second bonding pads 131 and third bonding pads 133, respectively. Second wires 132 may connect the second bonding pads 131 and the through-hole vias 110. Third wires 134 may connect the third bonding pads 133 and the through-hole vias 110.

The second semiconductor chip group 120b may include a second semiconductor chip 122b, a third semiconductor chip 124b, a fourth semiconductor chip 126b, and a fifth semiconductor chip 128b. The second, third, and fourth semiconductor chips 122b, 124b, and 126b may be electrically connected by penetration interconnections 125. Second bumps 115 may be formed on the lower surface of the second semiconductor chip 122b so as to contact the penetration interconnections 125. The second bumps 115 may connect the through-hole vias 110 in a flip chip manner. The fifth semiconductor chip 128b may include second bonding pads 136. Second wirings 135 may electrically connect the second bonding pads 136 and the through-hole vias 110. Although one form of the first and second semiconductor chip groups 120a and 120b are discussed above, it should be understood that other variations are also possible.

Figure 3C:
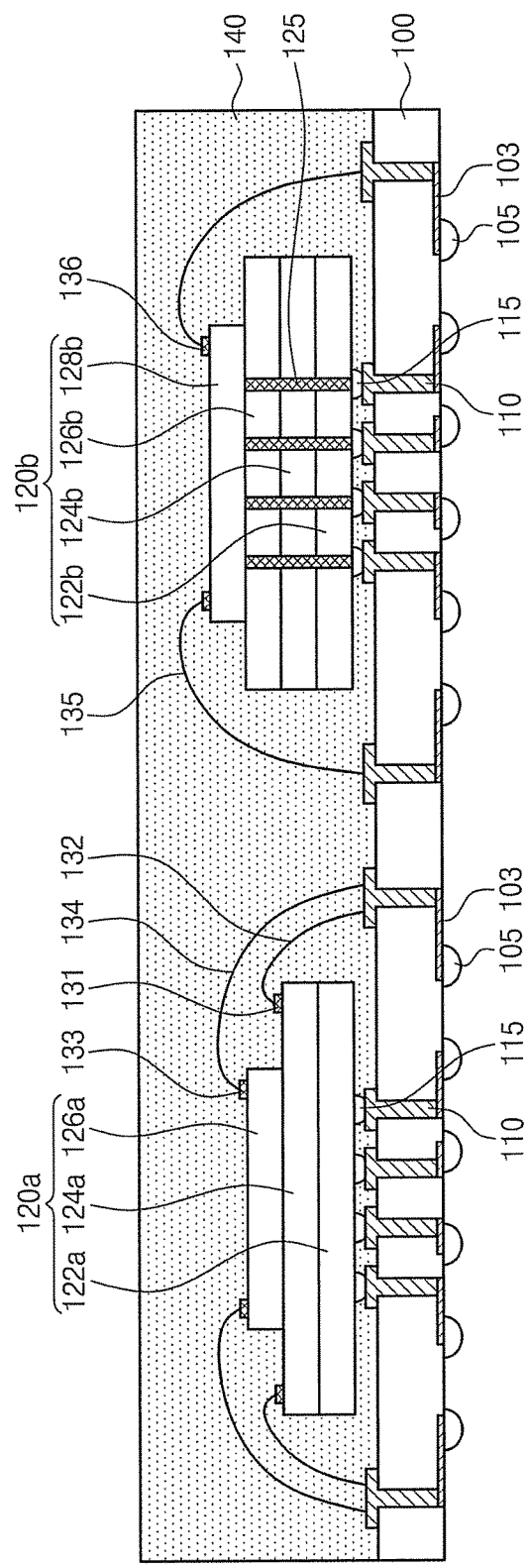

Referring to FIG. 3C, an encapsulation layer 140 may be formed so as to cover the upper surfaces of the first semiconductor chip group 120a, the second semiconductor chip group 120b, and the semiconductor substrate 100. The encapsulation layer 140 may be formed of an epoxy molding compound (EMC). The lower surface of the semiconductor substrate 100 may be etched to reduce the thickness of the semiconductor substrate 100. Etching the lower surface of the semiconductor substrate 100 may include performing a mechanical polishing process followed by a wet etch process. The etching time may be reduced by performing the mechanical polishing process first.

Redistribution patterns 103 may be formed on the lower surface of the semiconductor substrate 100 so as to contact the through-hole vias 110. First bumps 105 may be formed on the lower surface of the semiconductor substrate 100 so as to contact the redistribution patterns 103. Accordingly, an interposer I may include the semiconductor substrate 100, the through-hole vias 110, the redistribution patterns 103, and the first bumps 105.

Figure 3D:
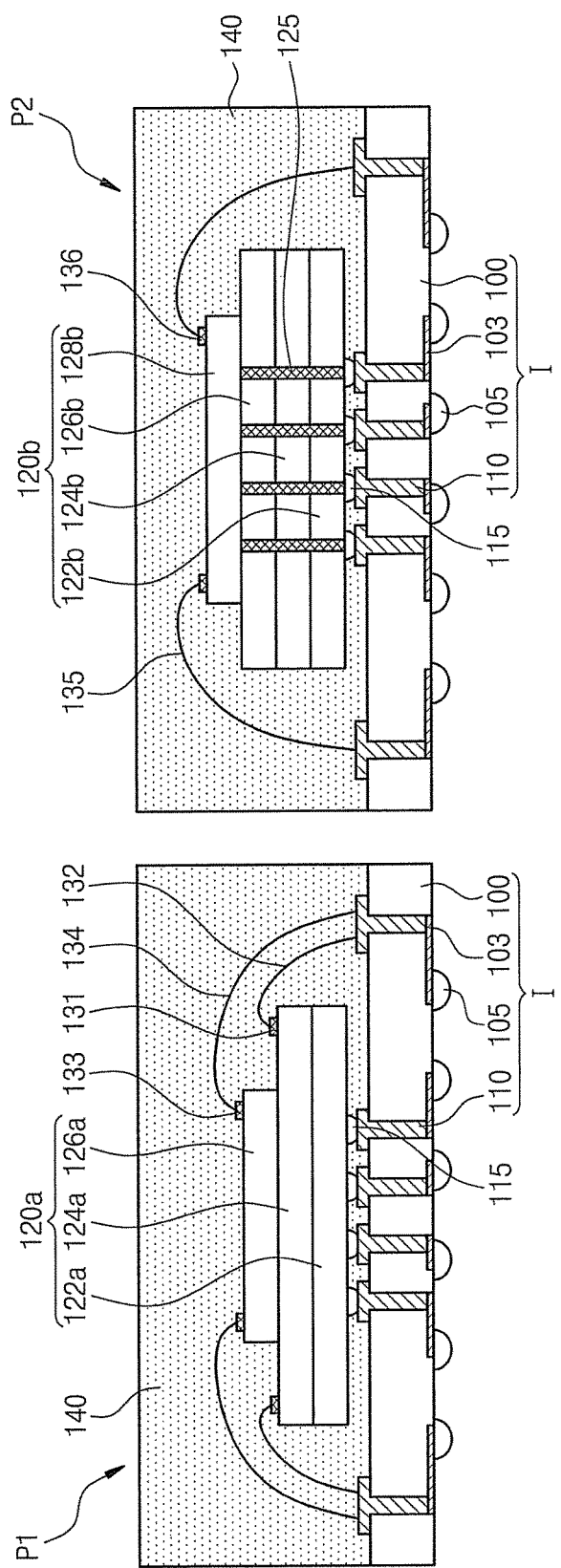

Referring to FIG. 3D, the semiconductor substrate 100 may be cut to separate the first and second semiconductor chip groups 120a and 120b, thus generating a first chip package P1 and a second chip package P2. Before cutting the semiconductor substrate 100, a wafer level test may be performed to identify devices of relatively high quality.

The first chip package P1 may be mounted on a first semiconductor chip 20 (e.g., FIG. 1A). Alternatively, the second chip package P2 may be mounted on a first semiconductor chip 20 (e.g., FIG. 1B). Mounting the first chip package P1 or the second chip package P2 on the first semiconductor chip 20 may include joining the first bumps 105 to the first bump pads 24. A molding layer (not shown) may be formed so as to cover the first chip package P1, the first semiconductor chip 20, and the PCB 10 so as to achieve the semiconductor package of FIG. 1A.

Alternatively, a molding layer (not shown) may be formed so as to cover the second chip package P2, the first semiconductor chip 20, and the PCB 10 so as to achieve the semiconductor package of FIG. 1B. The molding layer may be formed of EMC.

According to example embodiments, a chip package may be directly mounted on a semiconductor chip. Even when the locations of the pads and the bumps of a logic device and a memory device are modified, an electrical connection may still be achieved by means of an interposer. Consequently, a semiconductor package capable of relatively high-speed operation may be realized, regardless of whether design modifications may need to be made in connection with a logic device and a memory device.

Figure 4:
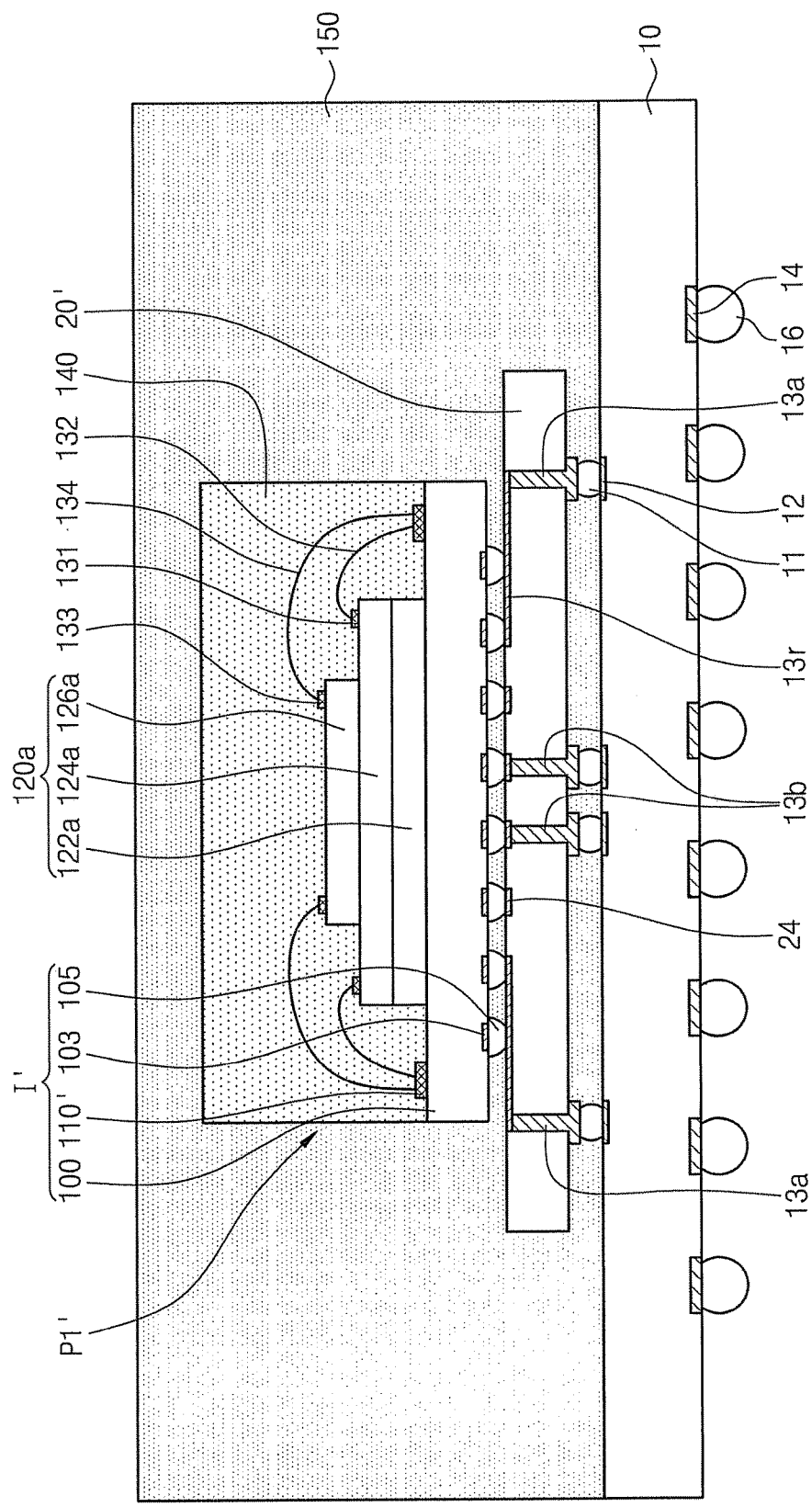
FIG. 4 is a cross-sectional view of a semiconductor package according to example embodiments.

FIG. 4 is a cross-sectional view of a semiconductor package according to example embodiments. Referring to FIG. 4, the semiconductor package may include the printed circuit board (PCB) 10, a first semiconductor chip 20' and a chip package P1'. The lower substrate patterns 14 may be disposed on the lower surface of the PCB 10. The solder balls 16 may be adhered to the lower substrate patterns 14. The solder balls 16 may electrically connect the PCB 10 to an external circuit. Upper substrate patterns 12 may be disposed on the upper surface of the PCB 10.

The first semiconductor chip 20' may be disposed on the PCB 10. The PCB may include, for example, an organic material such as, epoxy compound (e.g., FR4, BT), resin or polyimide. In an embodiment, the first semiconductor chip 20' includes through hole vias 13a, 13b. The through hole vias 13a, 13b pass through the first semiconductor chip 20'. Solder balls 11 can be used to electrically connect the through hole vias 13a, 13b and the upper substrate patterns 12. In an embodiment, the first semiconductor chip 20' can be underfilled using, for example, an adhesive to provide a stronger mechanical connection. A redistribution line 13r can be provided on the first semiconductor chip 20' to electrically connect the through hole via 13a and the chip package P1' through, for example, the first bump 105. As such, an electrical path from the PCB 10 to the chip package P1' is longer when a signal passes through the through hole via 13a as compared when a signal passes through the through hole via 13b. Accordingly, the short path using the through hole via 13b can be used for providing signals while the long path using the through hole via 13a can be used for providing power or ground.

The first semiconductor chip 20' may be a non-memory device (e.g., a logic device). The first bump pads 24 may be disposed on the upper surface of the first semiconductor chip 20'. The first bump pads 24 may be disposed near the center of the upper surface of the first semiconductor chip 20'. An active area can be formed on the lower surface of the first semiconductor chip 20'. In an embodiment, an active area can be formed on the upper surface of the first semiconductor chip 20'.

The chip package P1' may be directly connected to the first semiconductor chip 20'. The chip package P1' may include a substrate (e.g., an interposer I'), the semiconductor chip group 120a, and the encapsulation layer 140. The interposer I' may electrically connect the first semiconductor chip 20' and the semiconductor chip group 120a. A single chip can be used instead of the semiconductor chip group 120a.

The interposer I' may include a PCB. The PCB may include, for example, an organic material such as, for example, an epoxy compound (e.g., FR4, BT), resin or polyimide.

Referring to FIGS. 1A and 4, I' of FIG. 4 may be replaced as I of FIG. 1A such that an interposer including the semiconductor substrate 100 having the through-hole vias 110, the redistribution patterns 103 connected to the through-hole vias 110, and first bumps 105 connected to the redistribution patterns 103 can be used. The redistribution patterns 103 may be disposed on an insulation layer on a lower surface of the semiconductor substrate 100. The first bumps 105 may be disposed on the lower surface of the semiconductor substrate 100 so as to be connected to the redistribution patterns 103 and the first bump pads 24 on the first semiconductor chip 20.

The semiconductor chip group 120a may be disposed on the interposer I'. The semiconductor chip group 120a may include the flip chip 122a as the second semiconductor chip, the third semiconductor chip 124a, and the fourth semiconductor chip 126a. Second bumps 115 may be provided on the lower surface of the flip chip 122a. The second bumps 115 may be connected to the through-hole vias 110. The flip chip 122a, the third semiconductor chip 124a, and the fourth semiconductor chip 126a may be memory devices. Adhesive layers may be interposed between the flip chip 122a and the third semiconductor chip 124a and between the third semiconductor chip 124a and the fourth semiconductor chip 126a.

The third semiconductor chip 124a and the fourth semiconductor chip 126a may be electrically connected to the through-hole vias 110 by second wires 132 and third wires 134, respectively. The encapsulation layer 140 may be provided to cover the semiconductor chip group 120a and the interposer I'. The encapsulation layer 140 may include an epoxy molding compound (EMC). A molding layer 150, another form of an encapsulation layer, may be provided to cover the encapsulation layer 140, the first semiconductor chip 20, and the PCB 10. The molding layer 150 may be formed of the same material as the encapsulation layer 140. Alternatively, the molding layer 150 may be formed of a different material from the encapsulation layer 140.

The semiconductor group 120a can be disposed on the interposer I' using an adhesive therebetween.

Figure 5:
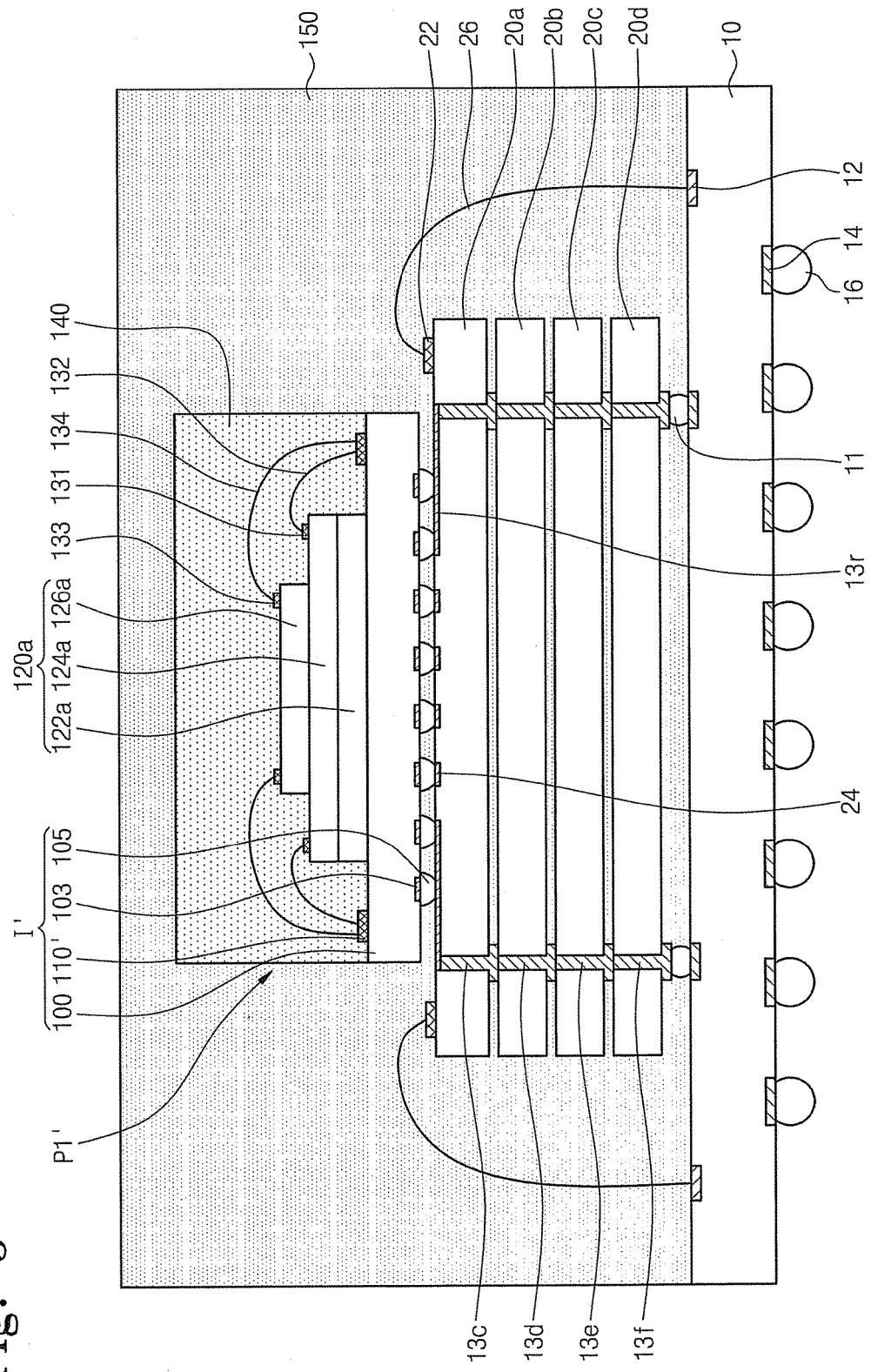
FIG. 5 is a cross-sectional view of a semiconductor package according to example embodiments.

FIG. 5 is a cross-sectional view of a semiconductor package according to example embodiments. Referring to FIG. 5, a plurality of semiconductor chips 20a, 20b, 20c, 20d can be stacked on top of one another. The semiconductor chips can be of a same type. As such, respective semiconductor chips 20a, 20b, 20c, 20d can have substantially a same size and a same thickness. According to an embodiment, semiconductor chips 20a, 20b, 20c, 20d include chips having a same function.

According to an embodiment, respective semiconductor chips 20a, 20b, 20c, 20d can have different sizes and thicknesses. According to an embodiment, semiconductor chips 20a, 20b, 20c, 20d include chips having different functions. Adhesive layers can be provided to join together adjacent semiconductor chips in the stack. According to an embodiment, solder ball bonding can be used to electrically connect the through hole vias 13c, 13d, 13e, 13f. The first bonding pads 22 on the semiconductor chip 20a may be electrically connected to the upper substrate patterns 12 on the PCB 10 by the first wires 26. The first wires 26 can be omitted. According to an embodiment, the semiconductor chip 20d can be disposed on the PCB 10 using an adhesive therebetween.

Figure 6:
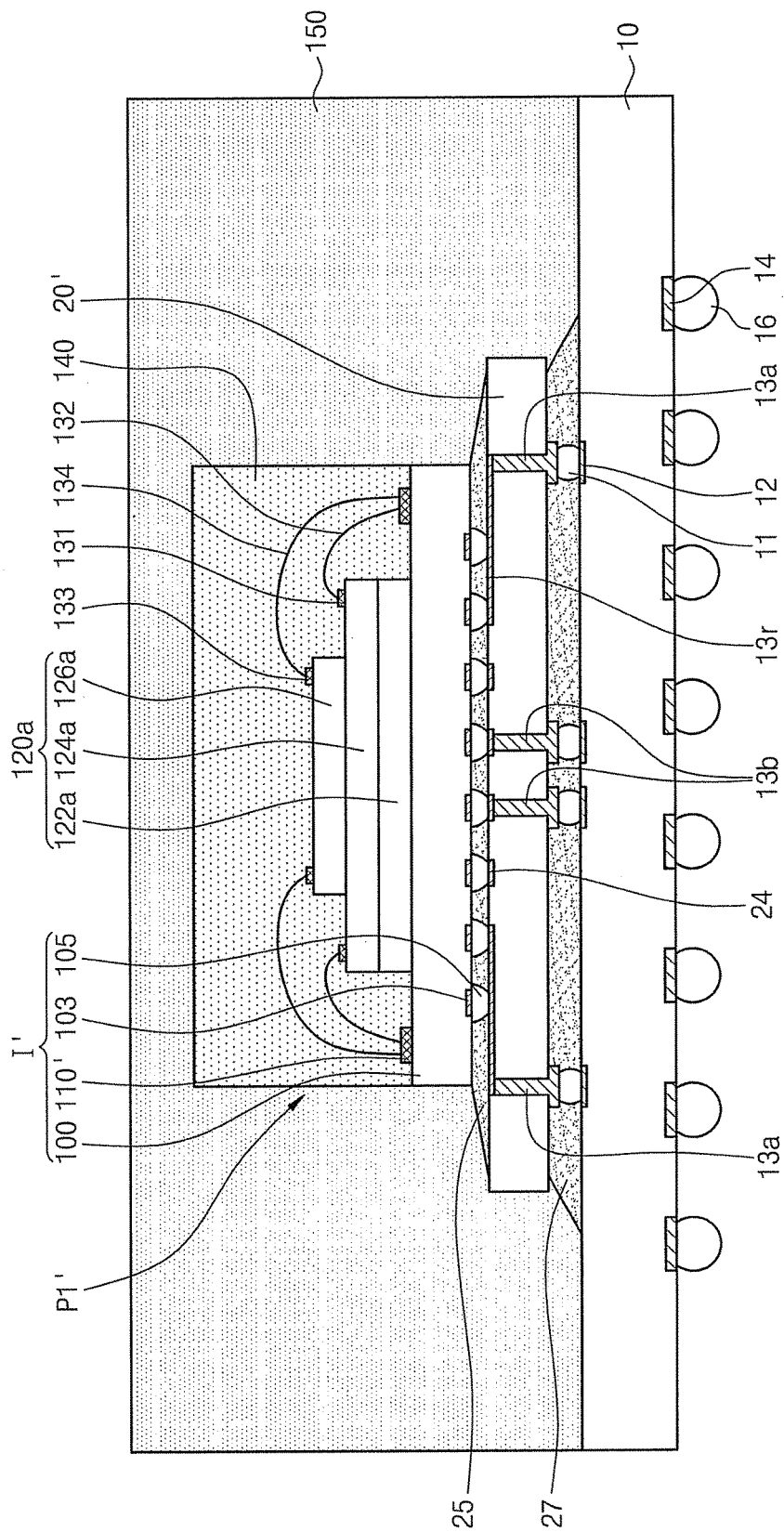
FIG. 6 is a cross-sectional view of a semiconductor package according to example embodiments.

FIG. 6 is a cross-sectional view of a semiconductor package according to example embodiments. Referring to FIG. 6, the first semiconductor chip 20' is underfilled using, for example, an adhesive 27 to provide a stronger mechanical connection. In an embodiment, the interposer I' can be underfilled using, for example, an adhesive 25.

Figure 7:
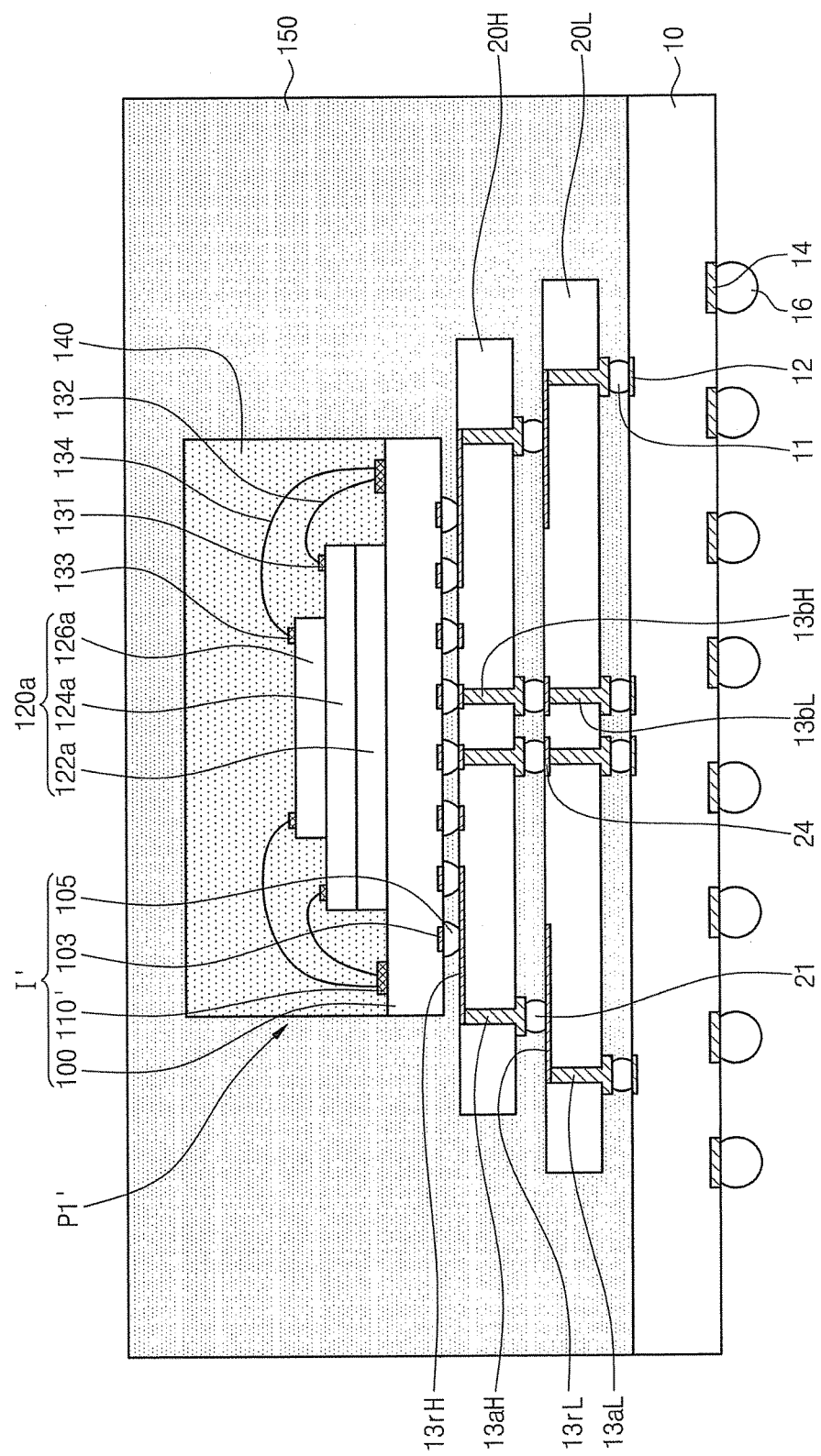
FIG. 7 is a cross-sectional view of a semiconductor package according to example embodiments.

FIG. 7 is a cross-sectional view of a semiconductor package according to example embodiments. Referring to FIG. 7, two different types of semiconductor chips 20L, 20H can be disposed on top of one another. In an embodiment, the semiconductor chips 20L, 20H can have different chip sizes. Redistribution lines 13rL, 13rH can be provided to electrically connect upper and lower through hole vias 13aH, 13aL. In an embodiment, an adhesive layer can be provided to join together adjacent semiconductor chips 20L, 20H in the stack. In an embodiment, solder ball bonding can be used to electrically connect upper and lower through hole vias 13bH, 13bL. Solder balls 11 can be used to electrically connect the through hole vias 13aL, 13bL and upper substrate patterns 12. In an embodiment, the upper through hole via 13aH is connected to the lower through hole via 13aL through the redistribution layer 13rL. In an embodiment, an electrical path through the through hole vias 13bH, 13bL is shorter than an electrical path through the through hole vias 13aH, 13aL. The shorter path can be used to transmit signals while the longer path can be used to transmit power or ground.

Figure 10A:
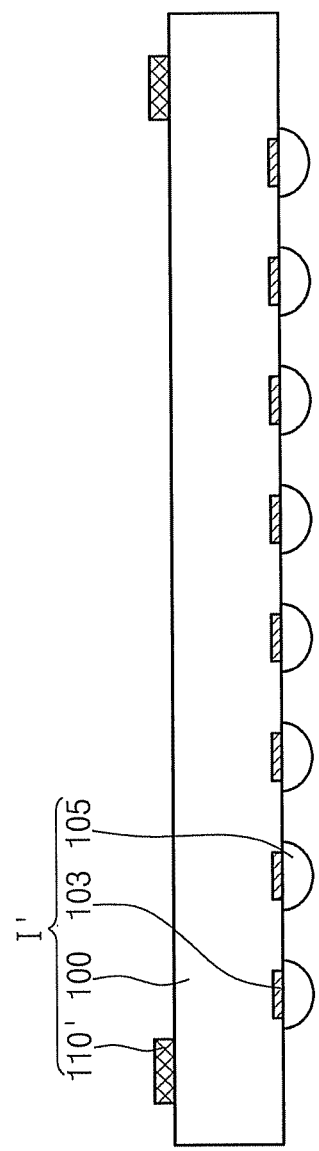

FIGS. 8-10 show a method of forming a semiconductor package according to example embodiments.

Referring to FIG. 8, the PCB 10 including lower substrate patterns 14 and upper substrate patterns 12 is provided. The solder balls 16 are deposited on the lower substrate patterns 14. The upper substrate patterns 12 are provided to receive the solder balls 11.

Referring to FIG. 9 (A), a plurality of through hole vias 13a, 13b are disposed substantially vertically in the first semiconductor chip 20'. Forming the through-hole vias 13a, 13b may include creating via holes 17 in the first semiconductor chip 20' with a laser drill and filling the via holes 17 with a conductive metal. The via holes 17 may be filled with a conductive metal using an electroplating method.

Referring to FIG. 9(B), a plurality of bump pads can be disposed on respective lower ends of the plurality through hole vias 13a, 13b. A plurality of bump pads can be disposed on respective upper ends of the plurality through hole vias 13a, 13b. In an embodiment, a plurality of redistribution lines 13r can be disposed on the upper surface of the first semiconductor chip 20' to be electrically connected with the through hole vias 13a. Referring to FIG. 9(C), the solder balls 11 are disposed on the respective bump pads of the lower surface of the first semiconductor chip 20'.

Figure 10B:
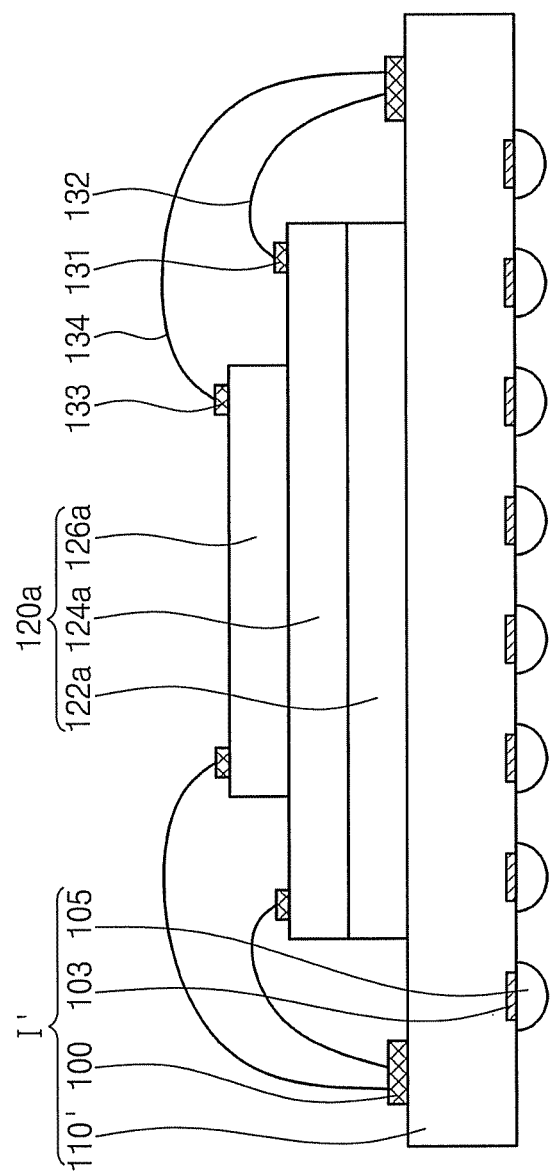

Referring to FIG. 10 (A), the interposer I' including, for example, an organic material such as, epoxy compound (e.g., FR4, BT), resin or polyimide is provided. A plurality of bumps 105 are disposed on the lower surface of the substrate 100. The plurality of bump pads 24 and redistribution lines 13r may receive respective bumps 105. Referring to FIG. 10(B), the semiconductor chip group 120a or 120b can be disposed on the upper surface of the interposer I'.

Figure 10C:
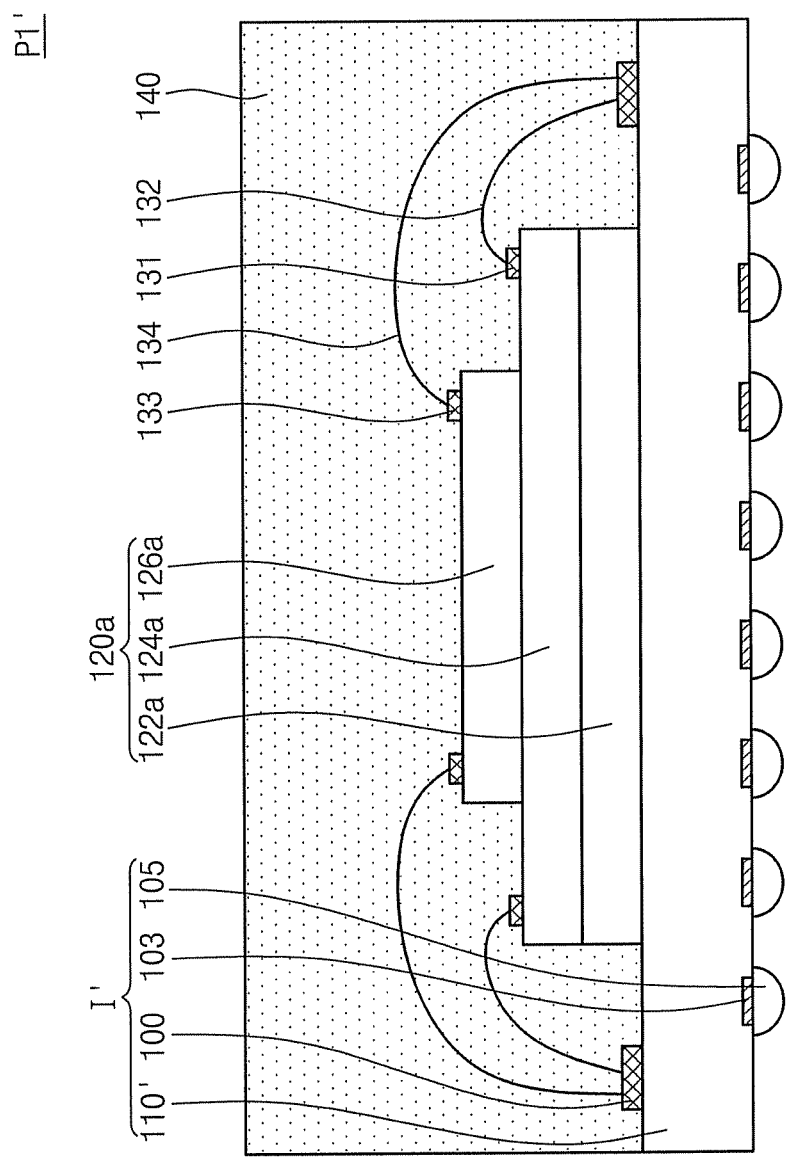

Referring to FIG. 10(C), the encapsulation layer 140 can be disposed to cover the semiconductor chip group 120a and the interposer I'.

In an embodiment, the first chip package P1' may be mounted on the first semiconductor chip 20'. Mounting the first chip package P1' on the first semiconductor chip 20' may include joining the first bumps 105 to the first bump pads 24. A molding layer may be formed to cover the first chip package P1', the first semiconductor chip 20', and the PCB 10 to manufacture the semiconductor package of FIG. 4. The molding layer may include EMC.

Although example embodiments have been described herein with reference to the accompanying drawings, it is to be understood that the present disclosure should not be limited to these examples and that various other changes and modifications may be affected therein by one of ordinary skill in the related art without departing from the scope or spirit of the invention. All such changes and modifications are intended to be included within the scope of the inventions as defined by the appended claims.

What is claimed is:

1. A chip package comprising:
   a semiconductor substrate including a plurality of through-hole vias, the semiconductor substrate having a first area and a second area on a surface of the semiconductor substrate;
   a first semiconductor chip disposed on the first area of the surface of the semiconductor substrate;
   a plurality of second semiconductor chips disposed on the second area of the surface of the semiconductor substrate, the plurality of second semiconductor chips being stacked on one another;
   a plurality of interconnections penetrating through at least one chip among the plurality of second semiconductor chips, the plurality of interconnections being configured to electrically connect at least two chips among the plurality of second semiconductor chips;
   a first bonding pad disposed on the first semiconductor chip; and
   a second bonding pad disposed on one of the plurality of second semiconductor chips,
   wherein the first semiconductor chip is not penetrated by a penetrating interconnection.

2. The chip package of claim 1, wherein an uppermost chip of the plurality of second semiconductor chips is smaller than other chips among the plurality of second semiconductor chips.

3. The chip package of claim 1, wherein the plurality of interconnections are configured to be electrically connected to the plurality of through-hole vias.

4. The chip package of claim 1, wherein the first semiconductor chip is a memory device.

5. The chip package of claim 1, wherein the plurality of second semiconductor chips include a memory device.

6. The chip package of claim 1, wherein the plurality of interconnections do not penetrate through an uppermost chip of the plurality of second semiconductor chips.

7. The chip package of claim 1, wherein the first semiconductor chip is a flip chip.

8. The chip package of claim 1, wherein a lowermost chip of the plurality of second semiconductor chips is a flip chip.

9. The chip package of claim 1, further comprising:
a plurality of first bumps disposed on a first surface of the first semiconductor chip, each of the plurality of first bumps being connected to a corresponding through-hole via among the plurality of through-hole vias; and
a plurality of second bumps disposed on a first surface of a lowermost chip of the plurality of second semiconductor chips, each of the plurality of second bumps being connected to a corresponding through-hole via among the plurality of through-hole vias and connected to a corresponding interconnection among the plurality of interconnections.

10. The chip package of claim 1, further comprising:
a first wire configured to connect the first bonding pad and one of the plurality of through-hole vias; and
a second wire configured to connect the second bonding pad and one of the plurality of through-hole vias.

11. A semiconductor package comprising:
a printed circuit board (PCB);
a first semiconductor chip disposed on the PCB;
a chip package disposed on the first semiconductor chip, the chip package including:
a semiconductor substrate including a plurality of through-hole vias;
a plurality of second semiconductor chips disposed on the semiconductor substrate, the plurality of second semiconductor chips being stacked on one another;
a plurality of interconnections penetrating through at least one chip among the plurality of second semiconductor chips, the plurality of interconnections being configured to electrically connect at least two chips among the plurality of second semiconductor chips;
a bonding pad disposed on one of the plurality of second semiconductor chips; and
a first molding layer encapsulating a portion of the first semiconductor chip and a portion of the plurality of second semiconductor chips; and
a second molding layer encapsulating a portion of the first semiconductor chip and a portion of the chip package.

12. The semiconductor package of claim 11, wherein the plurality of interconnections do not penetrate through an uppermost chip of the plurality of second semiconductor chips.

13. The semiconductor package of claim 11, wherein the first semiconductor chip is a non-memory device.

14. The semiconductor package of claim 11, wherein the plurality of second semiconductor chips include a memory device.

15. The semiconductor package of claim 11, wherein the plurality of interconnections are configured to be electrically connected to the plurality of through-hole vias.

16. The semiconductor package of claim 11, further comprising a wire configured to connect the bonding pad and one of the plurality of through-hole vias.

17. A semiconductor package comprising:
a printed circuit board (PCB); and
a chip package on the PCB, the chip package including:
a semiconductor substrate including a plurality of through-hole vias, the semiconductor substrate having a first area and a second area on a surface of the semiconductor substrate;
a first semiconductor chip disposed on the first area of the surface of the semiconductor substrate;
a plurality of second semiconductor chips disposed on the second area of the surface of the semiconductor substrate, the plurality of second semiconductor chips being stacked on one another; and
a plurality of interconnections penetrating through at least one chip among the plurality of second semiconductor chips, the plurality of interconnections being configured to electrically connect at least two chips among the plurality of second semiconductor chips,
wherein the first semiconductor chip is not penetrated by a penetrating interconnection.

18. The semiconductor package of claim 17, wherein the chip package includes a first molding layer encapsulating a portion of the first semiconductor chip and a portion of the plurality of second semiconductor chips.

19. The semiconductor package of claim 17, further comprising a second molding layer encapsulating a portion of the chip package.

20. The semiconductor package of claim 17, wherein the chip package includes a memory device.

* * * * *

UNITED STATES PATENT AND TRADEMARK OFFICE
CERTIFICATE OF CORRECTION

Page 1 of 1

PATENT NO. : 9,685,400 B2
APPLICATION NO. : 15/010826
DATED : June 20, 2017
INVENTOR(S) : Tae-Joo Hwang et al.

It is certified that error appears in the above-identified patent and that said Letters Patent is hereby corrected as shown below:

In the Claims

In Claim 11, the recitation of "first semiconductor chip" at Column 11, Lines 46-47, should be replaced with "semiconductor substrate."

In Claim 18, the recitation of "first semiconductor chip" at Column 12, Line 41, should be replaced with "semiconductor substrate."

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*